United States Patent
Glezer et al.

(10) Patent No.: US 6,588,497 B1
(45) Date of Patent: Jul. 8, 2003

(54) SYSTEM AND METHOD FOR THERMAL MANAGEMENT BY SYNTHETIC JET EJECTOR CHANNEL COOLING TECHNIQUES

(75) Inventors: Ari Glezer, Atlanta, GA (US); Raghavendran Mahalingam, Decatur, GA (US); Mark G. Allen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/126,867

(22) Filed: Apr. 19, 2002

(51) Int. Cl.⁷ ............................ F28G 7/00
(52) U.S. Cl. ............ 165/84; 165/908; 239/102.2
(58) Field of Search .............. 165/83, 84, 104.23, 165/104.25, 109.1, 908; 239/102.1, 102.2

(56) References Cited

U.S. PATENT DOCUMENTS

| | | | | |
|---|---|---|---|---|
| 4,171,852 A | * | 10/1979 | Haentjens | 417/322 |
| 4,180,377 A | * | 12/1979 | Itakura | 417/413 |
| 4,261,689 A | * | 4/1981 | Takahashi | 417/417 |
| 4,406,323 A | * | 9/1983 | Edelman | 165/84 |
| 4,450,505 A | * | 5/1984 | Mittal et al. | 361/386 |
| 4,495,947 A | * | 1/1985 | Motycka | 128/205.14 |
| 4,501,319 A | * | 2/1985 | Edelman et al. | 165/84 |
| 4,941,398 A | * | 7/1990 | Morris et al. | 98/2 |
| 5,034,688 A | * | 7/1991 | Moulene et al. | 324/158 |
| 5,087,175 A | * | 2/1992 | Raizman et al. | 417/96 |
| 5,121,290 A | * | 6/1992 | Azar | 361/384 |
| 5,395,592 A | * | 3/1995 | Bolleman et al. | 422/128 |
| 5,402,312 A | * | 3/1995 | Kinjo et al. | 361/695 |
| 5,742,954 A | * | 4/1998 | Idland | 4/541.1 |
| 5,861,703 A | * | 1/1999 | Losinski | 310/330 |
| 5,894,990 A | * | 4/1999 | Glezer et al. | 239/102.1 |
| 5,931,643 A | * | 8/1999 | Skaggs | 417/198 |
| 5,953,209 A | * | 9/1999 | Chiu | 361/697 |
| 5,988,522 A | * | 11/1999 | Glezer et al. | 239/102.1 |
| 6,059,020 A | * | 5/2000 | Jairazbhoy et al. | 165/84 |
| 6,123,145 A | * | 9/2000 | Glezer et al. | 165/104.33 |
| 6,315,031 B1 | | 11/2001 | Miyahara et al. | 165/80.3 |
| 6,343,014 B1 | | 1/2002 | Lin | 361/697 |
| 6,356,435 B1 | | 3/2002 | Davis et al. | 361/678 |
| 6,405,794 B1 | * | 6/2002 | Kim et al. | 165/84 |
| 6,457,654 B1 | * | 10/2002 | Glezer et al. | 239/102.2 |

* cited by examiner

*Primary Examiner*—Terrell McKinnon
(74) *Attorney, Agent, or Firm*—Thomas, Kayden, Horstemeyer & Risley LLP

(57) ABSTRACT

One embodiment of a thermal management system comprises a heated body, where a heat energy is contained within this heated body. This first embodiment also comprises an ambient fluid adjacent to an exterior surface of the heated body. Walls forming a channel are disposed within an interior of the heated body. The heat contained in the heated body is moved into at least one of these channel walls. The first embodiment comprises a synthetic jet actuator adjacent to one of the channel walls. The synthetic jet actuator is positioned so as to direct a synthetic jet flow through the channel. The operation of the synthetic jet actuator creates a flow consisting of the ambient fluid though the channel. This flow of ambient fluid cools the walls of the channel and thereby also cools the heated body itself.

25 Claims, 8 Drawing Sheets

SYSTEM AND METHOD FOR THERMAL MANAGEMENT BY SYNTHETIC JET EJECTOR CHANNEL COOLING TECHNIQUES

TECHNICAL FIELD

The present invention is generally related to thermal management technology and, more particularly, is related to a system and method for cooling heat producing bodies or components.

BACKGROUND OF THE INVENTION

Cooling of heat-producing bodies is a concern in many different technologies. Particularly, the rise in power dissipation levels of microprocessors, accompanied by a shrinking thermal budget has resulted in the need for new cooling solutions beyond the conventional thermal management techniques. Indeed, thermal management is a major challenge in the design and packaging of state-of-the-art integrated circuits in single-chip and multi-chip modules. The projected power dissipation levels of microprocessors are being reached well before their expected time. For example, while the International Technology Roadmap for Semiconductors, predicted a junction-ambient thermal resistance of 0.4° C./W for cost performance computers by 2005, the current Intel Reference Heat Sink requirements are already at a case-to-ambient thermal resistance of 0.4° C./W and expected to reduce further. International Technology Roadmap for Semiconductors, 1999 Edition, Semiconductors Industries Association Report, http://www.semichips.org/index2.htm. In addition, there is a rapidly growing need for new, more effective thermal management strategies to be used with small handheld devices, such as portable digital assistants (PDA's), mobile phones, portable CD players, and similar consumer products.

Traditionally, the need for cooling microelectronic devices has been met by using forced convective cooling with or without heat sink devices. Forced convection is effected using fans which provide either global overall cooling or locally-based cooling. The use of fans to globally or locally cool a heated environment often results in electromagnetic interference and noise generated by the magnetic-based fan motor. Use of a fan also requires relatively large moving parts in order to have any success in cooling a heated body or microelectronic component. These large moving parts naturally require high power inputs.

In certain implementations, traditional fans are used in conjunction with heat sinks. However, in order to achieve the ever-increasing power dissipation levels with current fan-heat-sink combinations, designers are being forced to use copper heat sinks or aluminum heat sinks with copper inlays. Additionally, the increased thermal management requirements have also necessitated larger fans driving higher flow rates. Since the power dissipation requirements have necessitated placing fans directly on the heat sink in some instances, the associated noise levels due to the flow-structure interaction have become an issue. Also, while fans are capable of supplying ample volume flow rate, they may be hindered by long-term reliability. In addition, fan based cooling systems are relatively inefficient in terms of the heat removed at a given volume flow rate.

The need for thermal management has also been met in some instances, as in handhelds like portable digital assistants ("PDAs"), cell phones, etc. . . , by employing a strategy of spreading the heat produced by an integrated circuit, or other device through the use of heat sinks and spreaders. Then the heat generated is permitted to dissipate through the outer shell, or skin, of the device via unforced convection. While these approaches are common, they offer certain drawbacks that will be exacerbated as new products that produce even more heat are developed. The difficulty with the heat spreading strategy is simply that it is often ineffective at removing adequate quantities of heat. On the other hand, the amount of heat to be removed may overly heat the casing of the handheld device, which is not desirable from a consumer use standpoint. In addition, the heat sinks and spreaders involved can be bulky and costly.

Thus, a heretofore unaddressed need exists in the industry to address the aforementioned deficiencies and inadequacies.

SUMMARY OF THE INVENTION

Embodiments of the present invention provide a system and method for thermal management of heated bodies or environments. Briefly described, in architecture, one embodiment of the system, among others, can be implemented as a system for cooling. This first exemplary embodiment comprises a heated body, where heat is contained within this heated body. The first embodiment also comprises an ambient fluid adjacent to an exterior surface of the heated body. Walls forming a channel are disposed within an interior of the heated body. The heat contained in the heated body is moved into at least one of these channel walls. Finally, the first embodiment comprises a synthetic jet actuator adjacent to one of the channel walls. The synthetic jet actuator is positioned so as to direct a synthetic jet flow through the channel. As will be explained in more detail below, the operation of the synthetic jet actuator creates a flow consisting of the ambient fluid though the channel. This flow of ambient fluid cools the walls of the channel and thereby the heated body.

Although there are many other embodiments of the present invention, briefly described, in architecture, another embodiment of the system can be implemented as an integrated heat sink module. This integrated heat sink module includes a heat sink material and a heat generating body adjacent to the heat sink material. This second embodiment also comprises a synthetic jet actuator incorporated into the heat sink module such that the synthetic jet actuator creates a flow of an ambient fluid along a surface of the heat sink material. This flow of ambient fluid carries heat away from the heat sink material.

The present invention can also be viewed as providing methods for cooling. In this regard, one embodiment of such a method, among others, can be broadly summarized as a method for cooling a device having heat producing components. This method has the steps of: providing a device having an exterior surface, wherein the heat producing components are disposed within the exterior surface of the device; further providing that the device has a duct passing though an interior of the device and the duct is open to an external environment; directing a heat generated by the heat producing components into a wall of the duct; generating a synthetic jet steam in the duct; and entraining an ambient fluid from the external environment of the device such that the entrainment causes the ambient fluid to flow though the duct and cool the wall of the duct.

Other systems, methods, features, and advantages of the present invention will be or become apparent to one with skill in the art upon examination of the following drawings

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

I. Synthetic Jet Actuators

A. Design with Chamber and Piezoelectric diaphragm

Figure 1A:
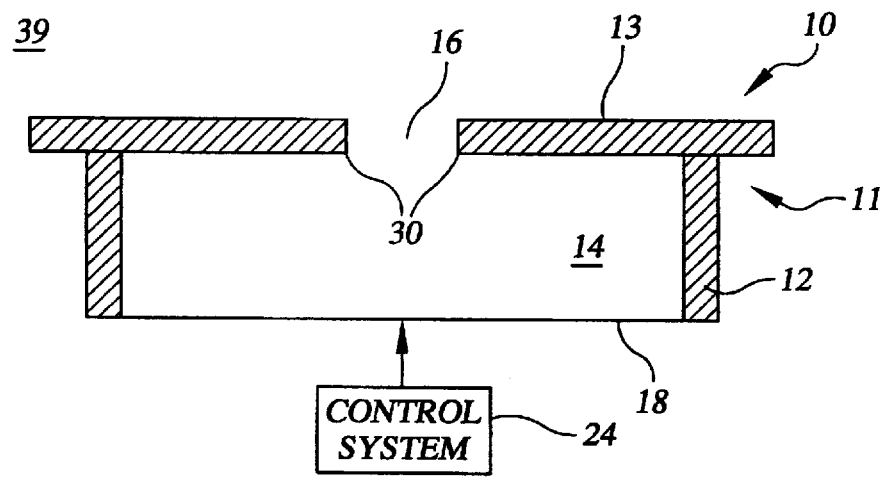
FIG. 1A is a schematic cross-sectional side view of a zero net mass flux synthetic jet actuator with a control system.

FIG. 1A depicts a basic example of a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

Alternatively, a piezoelectric actuator could be attached to the diaphragm 18. The control system would, in that case, cause the piezoelectric actuator to vibrate and thereby move the diaphragm 18 in time-harmonic motion. The method of causing the diaphragm 18 to modulate is not limited by the present invention.

Figure 1B:
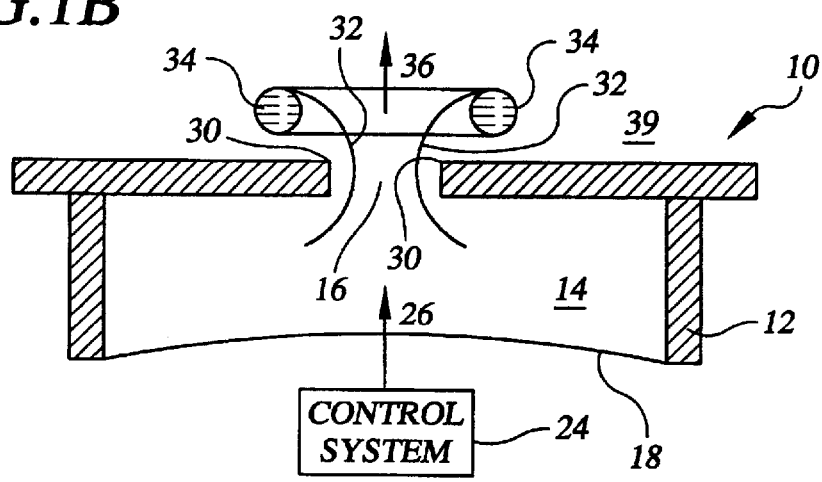
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
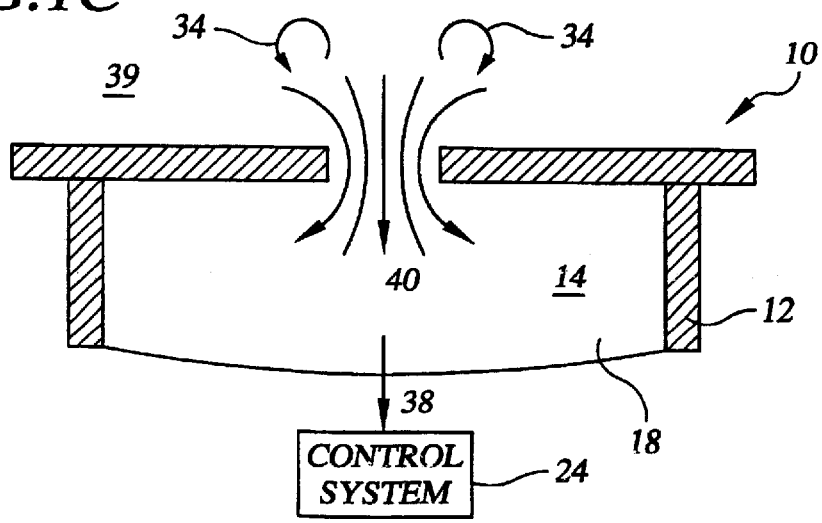
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

B. Synthetic Jet Actuator Having A Blade Design

Figure 2A:
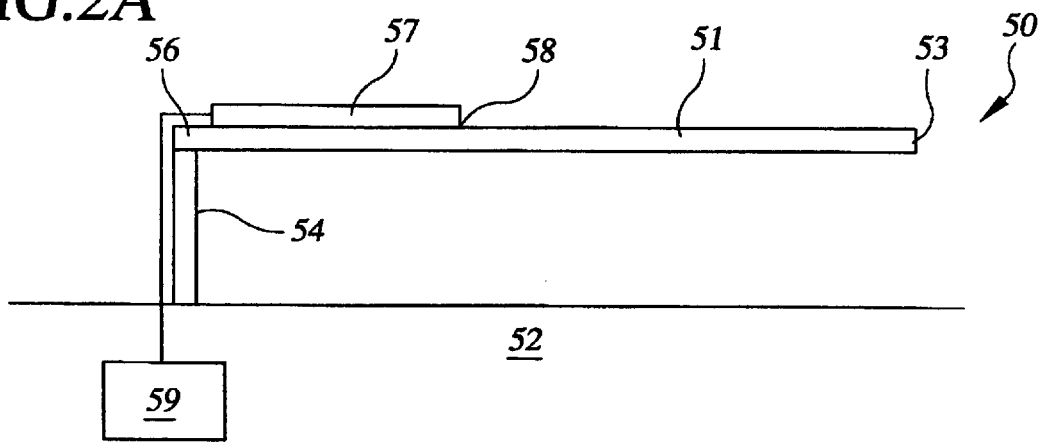
FIG. 2A is a schematic cross-sectional side view of a blade synthetic jet actuator with a control system.

Another device that can be used to create a synthetic jet stream is depicted in FIG. 2A. The synthetic jet actuator 50 of FIG. 2A is basically a cantilevered blade device. Specifically, in this example of a synthetic jet actuator 50, a flexible blade 51 is positioned a relatively short distance above a wall 52. The wall 52 could be any surface, such as, for example, the wall of a channel. The wall 52 need not be rigid, and, in certain configurations, could comprise a second flexible blade.

The blade 51 is free at a distal end 53 and attached to a support post 54 at a proximal end 56. The blade 51 may be attached to the support post 54 by any appropriate method. For example, the blade 51 could be attached to the post 54 by adhesive, welding, or rivets, among other possible attachment devices.

The size of the blade 51 is not critical to the present invention. Typically, the blade 51 will be on the order of a few inches long by a couple of inches in width. However, the blade 51 could be much larger, or, on the other hand, could be micromachined by common micromachining techniques. The blade 51 of the depicted example 50 is manufactured from a thin metallic material. The material is preferably thin enough to be flexible. The support post 54 is also preferably made from a metallic material. Although not required, it is desirable that the support post 54 be composed of a relatively rigid material. As can be seen in FIG. 2A, the support post 54 is attached to the wall 52 in such a way that the blade 51 is supported above the wall 52 in a cantilevered manner.

In the exemplary blade synthetic jet actuator 50, a piezoceramic slab 57 is adhered to a top surface 58 of the blade 51. The piezoceramic element 57 is supplied power for vibration from any suitable power source 59. One with ordinary skill in the art will be able to determine the appropriate power source based on the particular piezoceramic device employed. Of course, the blade synthetic jet actuator 50 can be actuated by other methods. The method of blade actuation is not critical to the present invention.

Figure 2B:
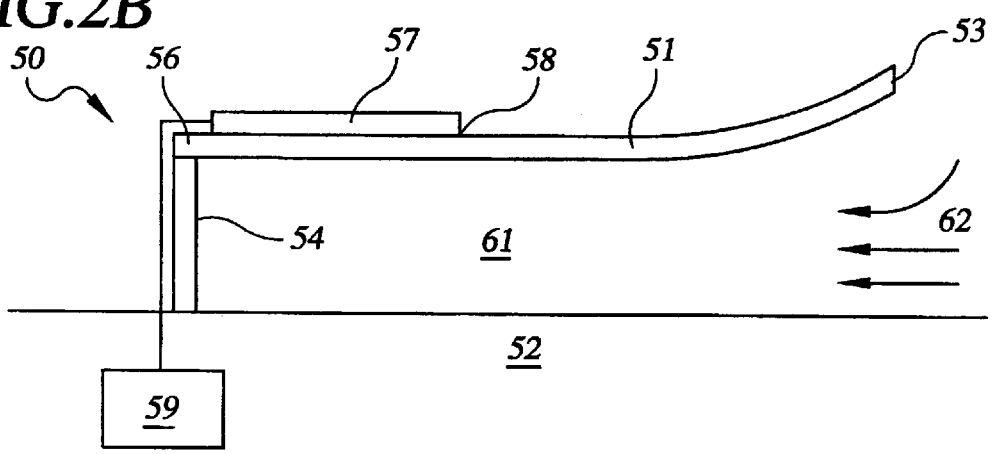
FIG. 2B is a schematic cross-sectional side view of the blade synthetic jet actuator of FIG. 2A depicting the jet as the control system causes the blade to travel upward, away from the wall.
Figure 2C:
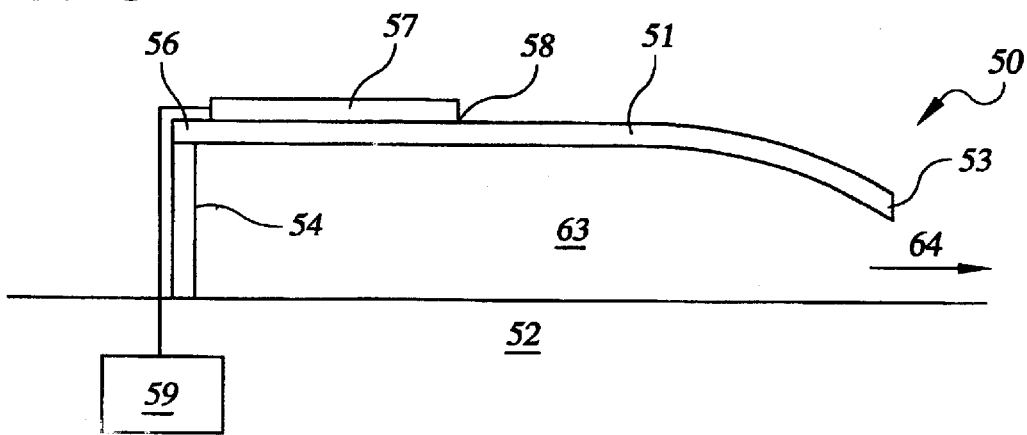
FIG. 2C is a schematic cross-sectional side view of the blade synthetic jet actuator of FIG. 2A depicting the jet as the control system causes the blade to travel downward, toward the wall.

FIGS. 2B–2C depict the blade synthetic jet actuator 50 in operation. To operate the synthetic jet actuator 50 of FIG. 2A, the power supply 59 is manipulated to cause the piezoceramic slab 57 to vibrate. Preferably, the piezoceramic slab 57 is caused to vibrate at the resonance frequency of the blade 51. The vibration of the piezoceramic slab 57 causes the blade 51 to flex upward and downward in time-harmonic motion. As shown in FIG. 2B, when the blade 51 flexes upward, a low pressure region 61 is generated between the blade 51 and wall 52. This low pressure region 61 causes fluid 62 to be drawn from the ambient, under the blade 51, and toward the support post 54. As the blade 51 moves downward (FIG. 2C), the fluid between the blade 51 and the wall 52 is subjected to an increased pressure. This high pressure region 63 forces fluid to move away 64 from the support post 54 and out from under the blade 51 at the distal end 53. The interaction between the fluid 64 moving out from under the blade 51 and the end 53 of the blade 51 creates a series of vortices (not depicted). These vortices roll up into vortex sheets that entrain additional ambient fluid to form a synthetic jet stream 64.

Over time, as the piezoceramic slab 57 causes time-harmonic motion of the blade 51, a steady synthetic jet forms emitting from the distal end 53 of the blade 51, away from the blade 51. The synthetic jet stream typically travels approximately parallel to the wall 52, although this is not a required feature of the depicted example 50. This device 50 may be used in a manner similar to the synthetic jet actuator 10 described above in reference to FIGS. 1A–1C.

II. Channel Cooling In General

Although cooling with synthetic jet actuators may take many advantageous forms, a preferred example is using one or more synthetic jet actuators for channel cooling, or ducted cooling, techniques. In one example of ducted cooling, a synthetic jet actuator is positioned in a channel on one wall of the channel. The synthetic jet actuator, in this manner, is incorporated into the structure of the channel. The synthetic jet actuator is positioned such that it creates a synthetic fluid flow approximately parallel to the duct wall. In this way, the synthetic jet actuator draws ambient fluid in one end of the duct, creates steady flow of ambient fluid through the duct, and ejects heated ambient fluid from the channel at an opposite end of the duct. In this most simple example, any type or number of synthetic jet actuators can be employed. This embodiment will be explained in more detail below.

Figure 3:
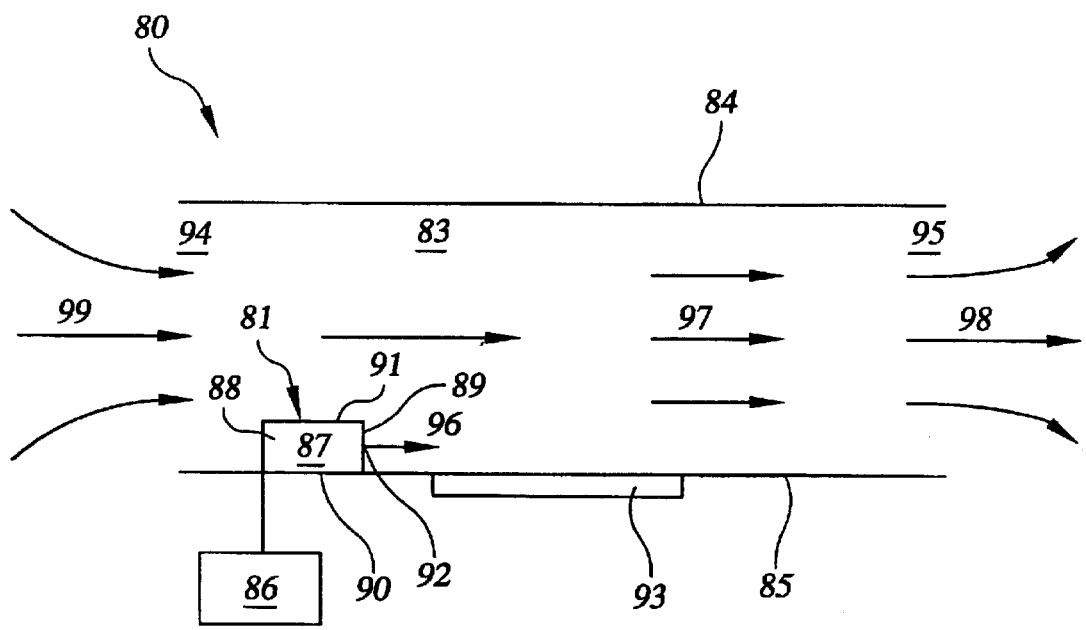
FIG. 3 is a cut-away side view of one example of a system employing at least one synthetic jet actuator for ducted cooling a heated body or environment.

FIG. 3 depicts a cut-away side view of one example of a system 80 employing at least one synthetic jet actuator 81 for ducted cooling of a heated body or environment. In the depicted example, there is a channel, or duct 83 cut through the heated body. The exemplary channel 83 has an upper wall 84 and a lower wall 85. The channel also has fore and rear walls, which are not depicted in FIG. 3. A synthetic jet actuator 81 is positioned adjacent to one wall 85 of the channel 83.

It is possible in some examples to have another synthetic jet actuator along the opposing wall 84 of the channel 83. Also, it is possible to position the synthetic jet actuator at one end of the channel 83. On the other hand, it may be desirable in certain embodiments to employ multiple synthetic actuators positioned at various points along the channel walls. Although these alternative designs are possible, and may be desirable in certain situations, these alternative embodiments are not depicted.

In the example shown in FIG. 3, the synthetic jet actuator 81 comprises a device similar to the synthetic jet actuator 10 of FIGS. 1A–1C. Specifically, the synthetic jet actuator 81 of the depicted example comprises a housing defining and enclosing an internal chamber 87. The housing is shown in cross-section in FIG. 3 to have a rigid back wall 88, a rigid front wall 89, a bottom wall 90, and a top diaphragm 91 that is flexible to an extent to permit movement of the diaphragm 91 inwardly and outwardly relative to the chamber 87. The front wall 89 has an orifice 92 that connects the internal chamber 87 to an interior environment of the channel 83.

In the depicted example, a piezoelectric actuator (not shown) is attached to the diaphragm 91 by a suitable attachment means. The piezoelectric actuator is wired to a power supply and control system 86. The power supply and control system 86 causes the piezoelectric actuator to vibrate and thereby move the diaphragm 91 in time-harmonic motion.

Other types of synthetic jet actuators could be used in the exemplary embodiment 80 depicted in FIG. 3. For example, the synthetic jet actuator could be equipped with louvers to increase the inflow of air, or to increase the ejection of air from the synthetic jet actuator chamber. As another example, a synthetic jet actuator could be operated by a piston that dynamically changes the volume of the actuator chamber. As yet another example, the synthetic jet actuator could comprise a blade-type jet actuator as described above in respect to FIGS. 2A–2C. The selection of the synthetic jet actuator is not critical to the present invention. Any type of synthetic jet actuator can be used with the present example 80.

In the depicted example, at least one wall 85 of the duct 83 is heated. In fact, the wall of this exemplary channel 83 comprises a heat spreading thermally conductive material, such as a metallic material. Of course, any heat spreader or heat sink material could be used, or none used at all if preferred in a particular application. However, the use of a heat spreader material is typically advantageous.

In the depicted example, a heat source 93 is positioned on one side of the lower channel wall 85. Typically, the heat source 93 will be positioned on the non-channel side of the lower wall 85. The heat source 93 could comprise a high power integrated circuit ("IC"), or other heat producing component. In the depicted example, the heat producing component 93 is thermally connected to the wall. In the depicted case, the IC 93 is physically connected to one side of the channel's lower wall 85.

In some instances, there may not be a specific heat producing object, such as an integrated circuit. In these instances, the body through which the channel 83 is cut may itself be heated, or heat producing. For example, the body may comprise a battery or fuel cell that emits heat as it is discharged. The example described herein and depicted in FIG. 3 would still be effective at removing heat from the interior portions of the body, whatever the body is or however the heat is generated. As another example, the body may comprise a shell or casing with many heat producing objects inside, none of which are thermally connected to the channel walls 84, 85. Still, the embodiment 80 depicted in FIG. 3 would be effective at removing heat from an interior portion of the shell, or casing.

Returning to the specific example depicted in FIG. 3, the channel 83 has two openings 94, 95. Both of these openings 94, 95 connect the channel interior with an ambient environment. For example, if the channel is to cool computer components, the channel could open to an exterior of the computer hardware case. As another example, if the channel is to cool a handheld microelectronic device, such as a mobile phone, then the channel openings 94, 95 could open to the exterior of the mobile phone body. Of course, the channel could communicate with a fluid source having a fluid such as cooled air, or refrigerant. The particular ambient environment, or source of fluid in the channel, is not critical to the present invention.

Because of the heat producing body 93, the ambient typically comprises air that is cooler than the heated wall 85 of the channel 83. When placed into operation, the synthetic jet actuator 81 begins to generate a synthetic jet flow 96. As outlined in detail above, this flow 96 is formed by entraining the air that fills the channel 83. As outlined above, a synthetic jet actuator 81 creates a fluid flow 96 from ambient fluid in the channel due to the interaction of vortices generated at the orifice 92 of the synthetic jet actuator 81 with the fluid in the channel 83. The synthetic jet flow 96 is substantially steady if the synthetic jet actuator 81 is operated at a sufficient frequency.

The entrainment of ambient fluid caused by the synthetic jet 96 creates a global airflow 97 through the channel 83. In essence, the synthetic jet actuator creates what is known as a jet pump, or jet ejector effect. As air is expelled 98 from one end 95 of the channel 83, other ambient air 99 is drawn into the opposing end 94 of the channel 83. Thus, a steady flow 97 of ambient fluid is created and maintained through the channel 83. In other words, because of the interaction of the synthetic jet actuator 81 with the fluid in the channel 83, cool ambient air 99 is drawn into the channel 83, pulled through the channel 83, and ejected 98 out the opposing end 95 of the channel 83.

As noted above, in the depicted example, an IC is thermally coupled to the lower wall of the channel. In this way, heat travels from the IC into the wall of the channel. Then, heat from the channel wall moves into the ambient fluid in the channel due to convection. This natural convection causes the lower wall of the channel to become cooler, thereby absorbing more heat from the IC, thereby cooling the IC.

In a typical scenario, where a synthetic jet actuator is not used and a simple steady flow of air is moved through a channel with heated walls, the heat given off by the walls stays in a region adjacent to the wall. Thus, the heat differential between the wall and the adjacent fluid is not very large, which slows the heat transfer from the wall to the ambient fluid. This fact can be problematic as less heat is transported away than could be if the entire volume of air in the channel was used to transport heat away from the channel wall.

The embodiment depicted in FIG. 3 solves these potential problems. The synthetic jet actuator 81 of the depicted embodiment creates turbulence in the fluid flow 97 due to the vortices that roll up at the orifice 92 of the synthetic jet actuator 81. The synthetic jet 81 effectively entrains and mixes the ambient fluid 97 throughout the channel 83. This physical phenomenon causes the most heated air near the wall 85 to more effectively mix with the ambient air flowing near the center of the channel 83, thereby more evenly distributing the heat among the channel air. This permits the ambient fluid 97 moving through the channel 83 to gather more heat from the heated wall 85 than would otherwise be possible if no synthetic jet actuator 81 was employed. In this way, use of a synthetic jet actuator 81 serves to more efficiently transport heat from the wall 85 (and thereby from the heat producing object 93) into the channel fluid 97, and out of the channel 83 into the ambient environment 98.

As an alternative example, a heat producing element, such as an IC, could be positioned inside the channel. In this embodiment, a synthetic jet actuator is placed within the channel, preferably along a wall of the channel. Then, when the actuator is operated, ambient flow is induced in the channel and the heated element is cooled through convection into the ambient air flowing in the channel. While this embodiment may not necessarily be preferred in all situations, this alternative embodiment constitutes another way to effectuate the invention disclosed herein.

Figure 4:
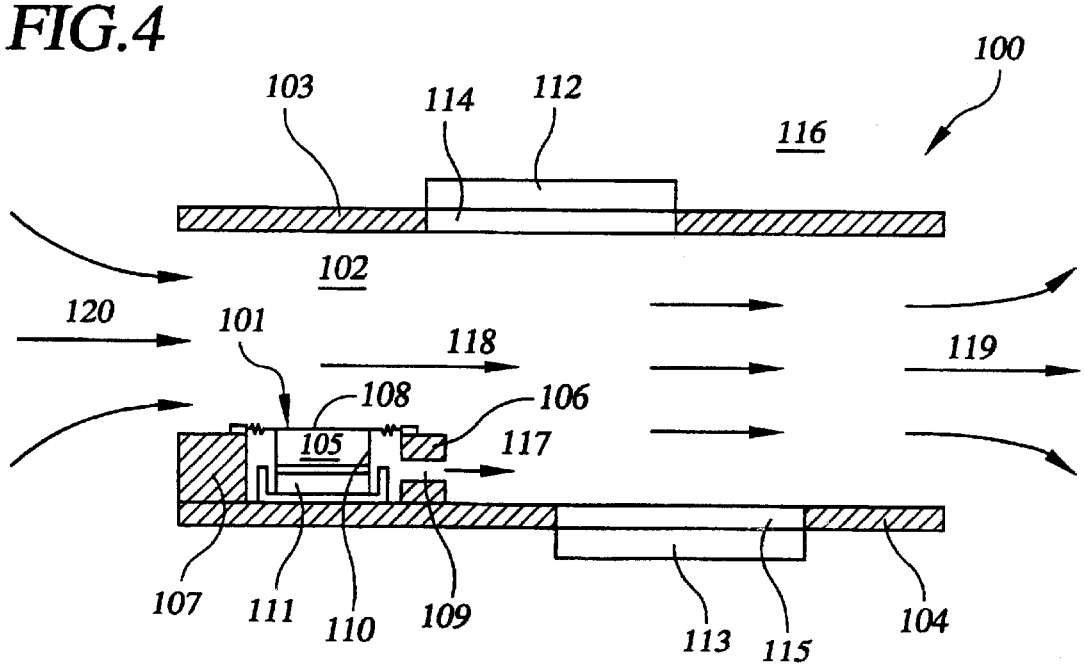
FIG. 4 is a cut-away side view of one example of a channel cooling system constructed into a printed wiring board material.

Another alternative embodiment of a channel cooling system comprises a channel-cooling system incorporated into a printed wiring board ("PWB"). Printed wiring boards are a composite of organic (i.e. epoxy) and inorganic (i.e. glass ceramic) material with external and internal wiring, allowing electronic components to be mechanically supported and electrically connected. The alternative embodiment depicted in FIG. 4 is a channel cooling module that is incorporated into the structure of the PWB during the manufacture of the PWB. This results in an increase in the functionality of the PWB to include thermal management as well as electrical interconnection and mechanical support.

FIG. 4 is a cut-away side view of a PWB cooling system 100 having a synthetic jet actuator 101. In the example, there is a channel 102 manufactured into the PWB. The channel 102 has an upper wall 103 that is comprised of a layer of PWB composite and a lower wall 104 that is also comprised of a PWB material. The synthetic jet actuator 101 is formed such that it is adjacent to the lower wall 104 of the channel 102. The channel 102 and the synthetic jet actuator 101 of the depicted example 100 are formed by a lamination process using multilayer epoxy-glass printed wiring board material. Basically, multiple layers of printed wiring board are patterned either by mechanical drilling or laser cutting to form the synthetic jet actuator and the channel. These layers are then stacked, aligned, and laminated to form the final PWB structure with embedded fluidic functionality.

In the depicted example 100, the synthetic jet actuator 101 comprises a housing enclosing a chamber 105. The housing is formed from various PWB material layers. In cross-section, the housing is depicted with a front wall 106, a rear wall 107, and a flexible diaphragm 108 for an upper wall. The front wall 106 has an orifice 109 that fluidically connects the chamber 105 with the interior of the channel 102.

An electromagnetic drive is used to drive the synthetic jet actuator 101. As depicted, the electromagnetic drive comprises a coil 110 which is driven using an alternating current, and a permanent magnet 111 which offers a constant magnetic field. When supplied with an alternating current, the coil 110 and magnet 111 drive a circuit that vibrates the diaphragm 108 in time-harmonic motion. One with ordinary skill in the art would understand how to construct and implement such a drive system. Of course, the particular type of drive system, and, in fact, the particular type of synthetic jet actuator are not critical to the present invention.

It is also not important how the PWB cooling module 100 is manufactured. Indeed, manufacturing of the example 100 depicted in FIG. 4 is typically accomplished by standard PWB manufacturing techniques. Specifically, the starting material is individual epoxy prepreg element layers. These layers are appropriately patterned using laser cutting. Then, the layers are stacked together, and are placed in a hot press for lamination. While stacking the layers, the diaphragm 108 and drive system are embedded in the PWB assembly. The diaphragm 108 is typically laminated directly on the PWB to ensure tight contact. In the preferred example, the diaphragm comprises Dyneon™ fluoroelastomer (a compound of 75% Dyneon™ FE-5621Q and 25% FC-2145 by weight).

As may be noted in FIG. 4, on an exterior side of each channel wall 103, 104, there is disposed a heat producing body 112, 113, such as a microelectronic component. The heat producing bodies 112, 113 are attached to the surface of the PWB. Where the heat producing bodies 112, 113 attach, the PWB has been embedded with a material that conducts thermal energy 114, 115. In this way, heat is moved from the heat producing bodies 112, 113, into the conductive material 114, 115, and then into the ambient fluid in the channel 102.

The PWB cooling system 100 operates exactly like the channel cooling system 80 described above with regard to FIG. 3. Specifically, the two ends of the channel 102 connect the channel interior 102 with an ambient environment 116. When placed into operation, the synthetic jet actuator 101 begins to generate a synthetic jet flow 117. The entrainment of ambient fluid caused by the synthetic jet 117 creates a global airflow 118 through the channel 102. As air is expelled 119 from one end of the channel 102, other ambient air 120 is drawn into the opposing end of the channel 102. Thus, a steady flow 118 of ambient fluid is created and maintained through the channel 102. This flow through the channel 102 removes heat from the conductive material 114, 115, which, in turn, cools the heat producing bodies 112, 113.

III. Ducted Heat Elector

Figure 5:
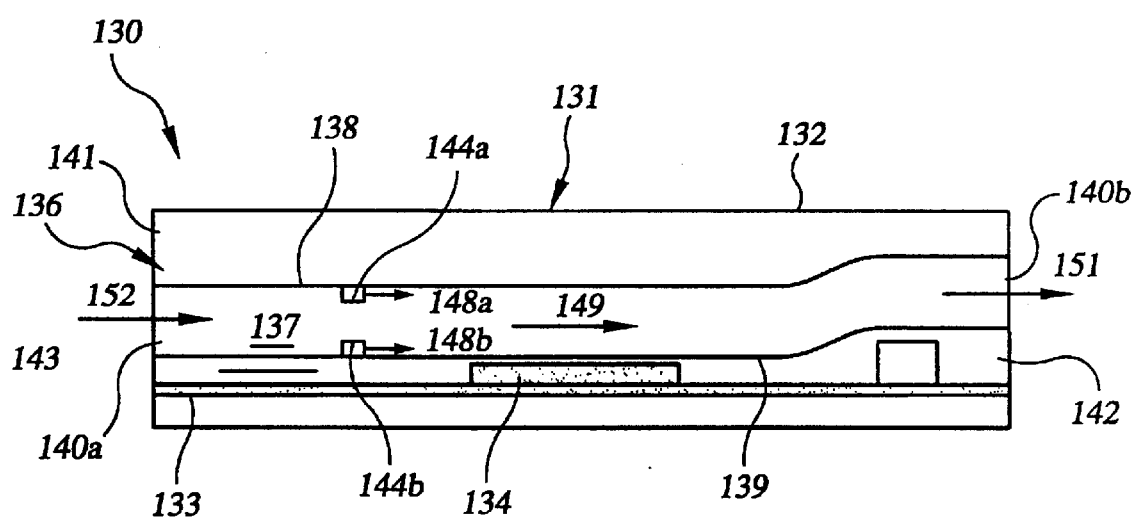
FIG. 5 is a schematic side view of a ducted heat ejector apparatus for a handheld device.

Another specific embodiment of the above-described channel cooling system and method is a ducted heat ejector apparatus. FIG. 5 depicts a cut-away side view of a ducted heat ejector apparatus 130 for a handheld microelectronic device, such as a mobile phone 131. Of course, the ducted heat ejector 130 could be used with a variety of heat-producing objects, such as other small microelectronic devices, batteries, fuel cells, or any other device that needs cooling.

The handheld device 131 depicted in FIG. 5 comprises a handset casing 132 that encloses all the electrical components of the handheld device 131. Among these components is a printed circuit board 133 including an integrated circuit chip 134 ("IC"). Of the components in a typical handheld device 131, such as a mobile phone, an IC 134 is one of the primary sources of heat generation inside the casing 132. For this reason, it is the goal of the present method and apparatus to remove a portion of the heat generated by the IC 134. Because of its small size, cooling the interior portion of the handset 131 is quite difficult. The apparatus 130 depicted in FIG. 5 accomplishes this goal through a ducted heat ejection module 136 built into the handset casing 132.

As depicted, the exemplary embodiment 136 comprises a duct, or channel 137 having an upper wall 138 and a lower wall 139. The duct 137 begins at one side 141 of the handset casing 132, and ends on an opposite side 142 of the handset casing 141. The duct 137 is designed with two openings 140a, 140b to the ambient 143. The size and shape of the duct 137 is not critical to this example and can be configured as desired or required by the shape and size of the handset 131. One advantage of the disclosed ducted cooling concept is that the duct can have a very high aspect ratio. This is not a feature that can be exhibited if a fan was used to drive cooling fluid though the chamber. One having ordinary skill in the art can determine the appropriate size and dimensions of the channel.

The duct walls 138, 139 may be constructed of any suitable material. In the depicted example, the duct walls 138, 139 are constructed of a thermally conductive metal material, such as steel, aluminum, or copper. The particular construction materials are not critical to the present invention. Rather, it is merely preferred that the duct walls be somewhat thermally conductive. The reasons for having thermally conductive walls will be discussed in more detail below.

Inside the duct 137 of the heat ejection module 130 is positioned a pair of synthetic jet actuators 144a, 144b. A first synthetic jet actuator 144a is positioned on the upper wall 138 of the duct 137 and a second synthetic jet actuator 144b is positioned on the lower wall 139 of the duct 137. The synthetic jet actuators 144a, 144b are positioned in such a way that a synthetic jet formed thereby will flow approximately along the walls 138, 139 of the channel 137. This feature is not required by the example. The synthetic jet actuators 144a, 144b could be positioned to eject fluid at some angle to the walls 138, 139.

Additionally, in an alternative embodiment, the synthetic jet actuators 144a, 144b could comprise arrays of synthetic jet actuators. Synthetic jet actuators may also be positioned on other walls of the channel. For example, if the channel is rectangular in cross-section, synthetic jet actuators could be positioned on each of the four channel walls. Multiple synthetic jet actuators could also be positioned at various longitudinal positions along the length of the channel 137. On the other hand, the synthetic jet actuators 144a, 144b could be positioned at one end 140a of the channel 137. One having ordinary skill in the art can tailor the number and positioning of synthetic jet actuators to achieve the required flow through the channel 137.

The synthetic jet actuators 144a, 144b may also take many possible forms. For example, the synthetic jet actuators can be designed similar to those described above in regard to the example of FIG. 3. This is the type of synthetic jet actuator actually depicted in FIGS. 8–9. On the other hand, the synthetic jet actuators may comprise blades attached to a support post extending from the channel walls, such as the synthetic jet actuator described above in respect to FIGS. 2A–2C. Depending on the type of synthetic jet actuator selected, power for the actuators may be supplied from a variety of sources. In the depicted example, the synthetic jet actuators draw power from a battery device (not depicted) that supplies power to the handheld device 131.

The channel 137 of the ducted heat ejector apparatus 130 is preferably aligned so that one wall 139 of the channel (the lower wall in FIG. 5) is in thermal contact with at least one heat producing element 134 in the mobile phone casing 132. In the example of FIG. 5, the heat producing element 134 comprises an integrated circuit ("IC"). The IC 134 is connected to the lower channel wall 139 in a manner such that heat will transfer freely from the IC 134 into the channel wall 139. Although not required, the walls 138, 139 of the channel 137 are composed of a thermal spreading material, such as a metallic material. Because of this construction, heat flows from the hot IC 134, into the thermal spreader material that forms the wall 139 of the channel 137.

It may be desirable in certain designs to thermally isolate the IC 134 or other heated bodies from the remainder of the mobile phone components inside the handset casing 132. This may be accomplished by physically separating the IC 134 with walls, or partitions, from the other components inside the casing 132. Of course, the IC 134 would preferably still remain thermally connected to a wall 139 of the channel 137.

In operation, the ducted heat ejector apparatus 130 begins operation when the synthetic jet actuators 144a, 144b are activated. The diaphragms of the synthetic jet actuators 144a, 144b oscillate in time harmonic motion through the vibration of piezoelectric elements on the diaphragms at a resonance frequency of the diaphragms. The motion of the diaphragms causes air from the channel 137 to be drawn into, and ejected from the synthetic jet chambers. As outlined above, this activity creates vortices at the synthetic jet orifices that cause a jet stream 148a, 148b to be synthesized from the air in the channel 137.

The entrainment of ambient fluid caused by the synthetic jets 144a, 144b creates an ambient airflow 149 through the channel 137 in addition to the synthetic jet streams 148a, 148b. Physically, the synthetic jets 144a, 144b of this example function like the basic example discussed above in relation to FIG. 3. As air is expelled 151 from one end 140b of the channel 137, other ambient air 152 is drawn into the opposing end 140a of the channel 137. Thus, a steady flow 149 of ambient fluid is created and maintained through the channel 137. It is this flow of cool ambient fluid 149 through the channel 137 that primarily causes the heated wall 139 of the channel 137 to emit heat into the ambient fluid and thereby become cooler. Physically, natural, unforced convection causes heat to travel from the heated wall 139 into the ambient fluid flow 149 that fills the channel 137.

Additionally, because the synthetic jets 144a, 144b in the channel 137 create a low pressure region in the channel 137, there is very little if any flow bypass around the channel 137. That is, most if not all of the ambient flow is caused to travel into and through the channel 137 due to the low pressure region created in the channel.

This method of heat transfer is a radically new concept for small handheld microelectronic devices, such as mobile phones. Typically, heat reduction strategy in mobile phone design is to spread the heat generated in the casing as much as possible using heat spreaders or heat sinks. The spreading is followed by heat rejection to the environment, mostly using free convection via the skin of the mobile phone. The above system and method dramatically changes this strategy and approach resulting in increased effectiveness of heat transfer from the interior of the handset to the ambient environment.

IV. Active Heat Sink

Figure 6:
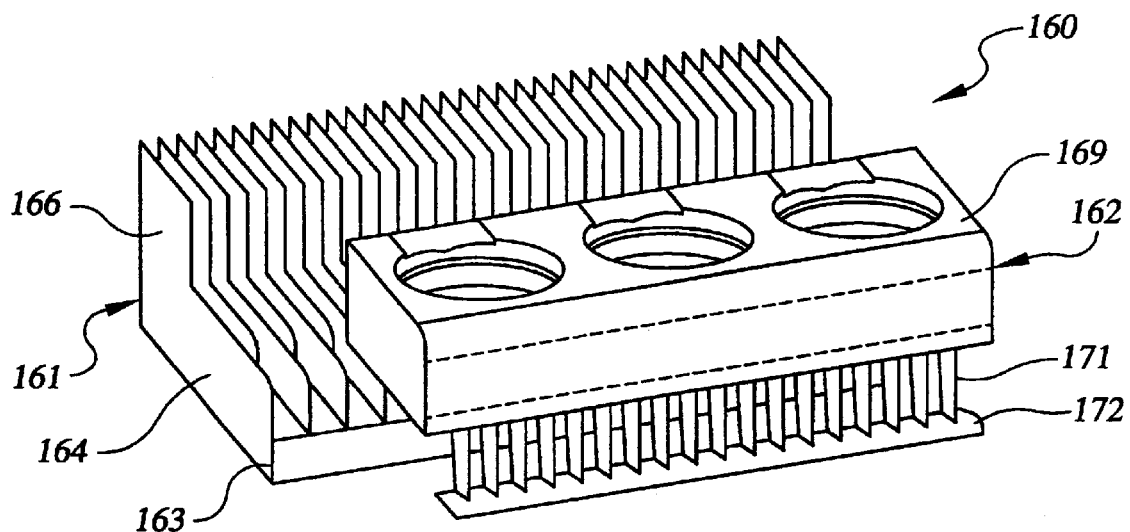
FIG. 6 is cut-away three-dimensional view of an active heat sink module.

Another specific embodiment of the above-described channel cooling system and method is an active heat sink module 160, depicted in FIG. 6. This device 160 uses the methods and techniques discussed above by creating a channel flow with synthetic jet actuators, as above. However, in this embodiment, the specific active heat sink module 160 has multiple synthetic jet actuators that create fluid flow through multiple channels, where the channels are created by the configuration of a heat sink. In essence the synthetic jet actuators and the heat sink are all a part of the same, integrated heat management and fluid flow device. As with the above examples, the exemplary embodiment depicted in FIG. 6 and described below is only an example of one possible active heat sink module. Other modifications are possible and are intended to be included in the present invention. Three exemplary modification will be discussed in some detail below.

As shown in FIG. 6, a first example of an active heat sink module 160 consists primarily of two parts: a heat sink component 161 and a synthetic jet module 162. The heat sink component 161 is machined into a shape and configuration such that the synthetic jet module 162 will mount flush with the heat sink component 161 forming a compact integrated package.

As can be seen from FIG. 6, the heat sink module 161 of the apparatus 160 comprises a relatively flat heat sink plate 163 with two sets of fins 164, 166 protruding from one side of the heat sink plate 163. The fins 164, 166 are substantially parallel to one another as they extend in a substantially perpendicular orientation from the heat sink plate 163. In the depicted example, the fins 164, 166 are manufactured to extend from the plate in two different lengths.

Of course, the heat sink module 161 could take many other shapes. For example, the fins 164, 166 are not required to have different lengths. Further, the configuration of the fins 164, 166, or orientation of the fins 164, 166 can be changed to fit the application of the module 160, or to tailor the amount of heat transferred into the fins 164, 166. The positioning of the fins 164, 166 is not critical to the invention disclosed herein. In fact, the heat sink component 161 does not even have to have fins 164, 166. One with ordinary skill in the art can determine the appropriate design for the heat sink component 161 to coordinate with the synthetic jet module 162 design desired. Other exemplary designs for the heat sink component will be discussed in more detail below.

Figure 7:
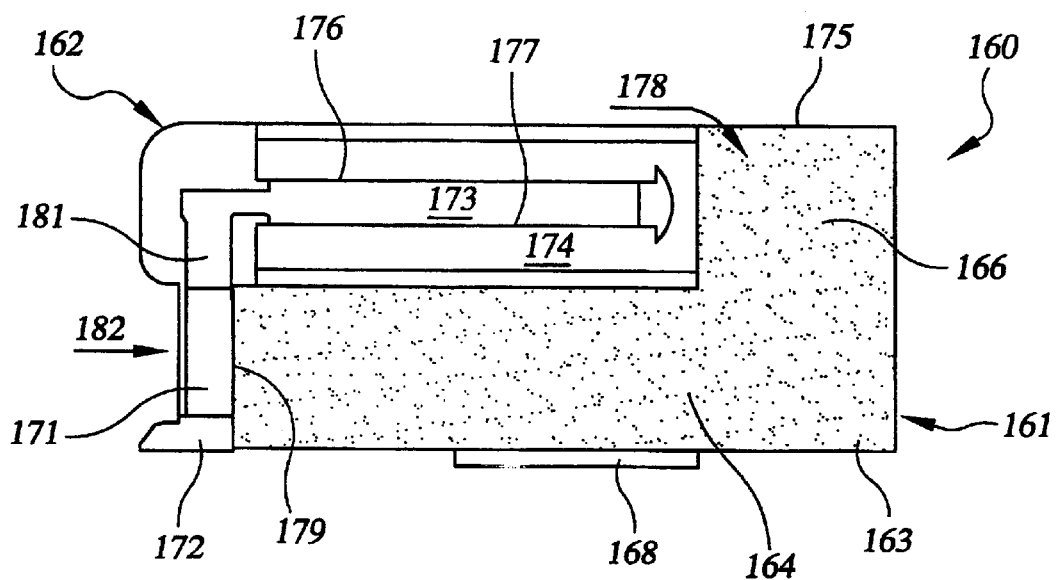
FIG. 7 is a cut-away side view depicting the operation of the synthetic jet actuators of the active heat sink module of FIG. 6.

As depicted in FIG. 7, which will be discussed in greater detail below, the sink plate 163 of the heat sink component 161 is thermally connected to an integrated circuit chip 168, or other heat-producing microelectronic element. In this way, the heat produced by the integrated circuit chip 168 is transferred into the sink plate 163, which, in turn, transfers heat into the fins 164, 166. The operation of a standard heat sink is well understood in the art and is not a critical part of the present invention.

The synthetic jet actuator module 162 specifically depicted in FIG. 7 is designed to mate with the heat sink module 161. As noted above, it is desirable that the two components 161, 162 are manufactured such that they will mount flush to one another forming an integrated, compact package 160. The synthetic jet module 162 consists of a drive region 169 and several spouts 171 extending from the drive region 169 to a base 172. The spouts 171 of the exemplary embodiment 160 are substantially parallel to one-another, but this is not a required feature of an active heat sink module 160. The drive region 169 is characterized by multiple actuator cavities that are used to generate synthetic jet flows from the module.

In the depicted example, the synthetic jet module 162 creates two sets synthetic jet streams. Each set consists of multiple individual synthetic jets. This is so that each side of each fin will have a synthetic jet create a flow adjacent to the fin. Of course, this is not a required feature—merely one example of a possible embodiment. One set of streams emits from the spouts 171 and one set of streams emits directly from the drive region 169. The drive region 169 comprises the mechanical features necessary to create these two distinct sets of synthetic jet streams. It is preferred to create the synthetic jet streams with jets that operate on the principles described above with respect to FIGS. 1A–1C. That is, it is preferred that the volume of a chamber be altered in time-harmonic motion to create a synthetic jet flow from an orifice in the chamber.

More specifically, the drive region 169 of the exemplary embodiment 160 has two chambers 173, 174. One of the chambers 173 (the "internal chamber") is disposed between the second chamber 174 (the "outer chamber"). The outer chamber 174 is divided into two potions that bound the internal chamber 173, but that are fluidically connected to one another.

As best depicted in FIG. 7, the internal chamber 173 is bounded on a top surface 176 and a bottom surface 177 by two flexible diaphragms. These two diaphragms 176, 177 each have electromagnetic actuators (not depicted) adhered thereto. Theses two electromagnetic actuators are wired to a power source (not depicted) such that they can be vibrated out of phase at a variety of frequencies. It is preferred that the electromagnetic actuators be driven sinusoidally and arranged such that the electromagnetic actuators create high pressure in the two unconnected cavities in each cycle of the actuator motion. More specifically, vibration of the electromagnetic actuators out of phase causes the two diaphragms 176, 177 to move in time harmonic motion away from one another, and then toward one another. As the diaphragms 176, 177 move away from one another, the volume of the internal chamber 173 is increased and the volume of the outer chamber 174 is similarly decreased. Conversely, when the diaphragms 176, 177 move toward one another, the volume of the internal chamber 173 is decreased and the volume of the outer chamber 174 is increased.

The outer chamber 174 is sealed, except for a series of orifices (not depicted) positioned adjacent to an upper end 175 of the longer fins 166. These orifices are positioned such that there is at least one orifice on each side of each longer fin 166. The orifices may be of any appropriate shape, but in the example depicted, the orifices comprise elongated slots substantially parallel to the longer fins 166. As the volume of the outer chamber 174 is increased, air is drawn into the chamber 174 through the orifices. Then, as the volume of the outer chamber 174 is decreased, the air in the chamber 174 is expelled through the orifices, vortices are formed at the orifices, and a synthetic jet stream is synthesized from an ambient fluid 178. As depicted in FIG. 7, the ambient fluid 178 is drawn from an area above the module 162, and caused to flow between the fins 166.

Figure 8:
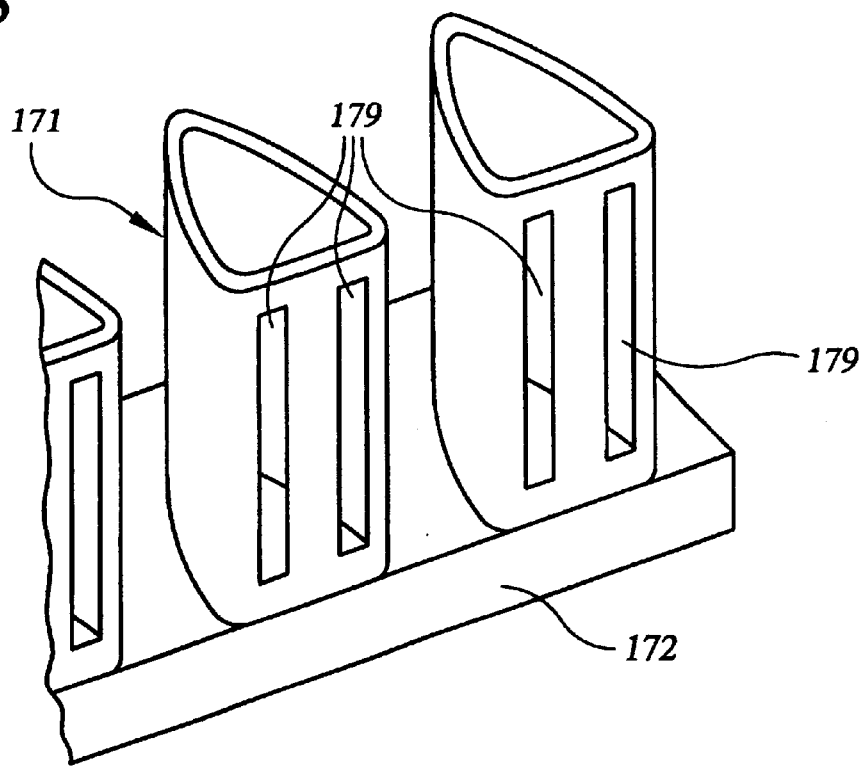
FIG. 8 is a cut-away perspective view of the spouts of the active heat sink module of FIG. 6.

The internal chamber 173 is also sealed except for a series of orifices 179 that are cut into the spouts 171 of the synthetic jet module 162. As is depicted in FIG. 7, the internal chamber 173 is fluidically connected to the spouts 171 though a sealed neck region 181. FIG. 8 is a cut-away perspective view of the spouts 171 that will assist in understanding the construction of the spouts 171 and the spout orifices 179. As can be seen from FIG. 8, there are two elongated orifices 179 in each spout 171. The orifices are shaped to be slots. However, any shape of orifice 179 would be feasible. In fact, it is possible and may be desirable in certain applications to have multiple orifices in a line, rather than a single slot orifice 179.

As will be noted from an observation of FIG. 8, the spouts 171 are positioned such that an edge of each lower fin 164 bisects the spout 171. In this way, one elongated orifice 179 ejects fluid on each side of each fin 164. Although not required, the slots 179 are aligned such that the fluid ejected from the orifices 179 will emit substantially parallel to each fin 164.

Figure 9:
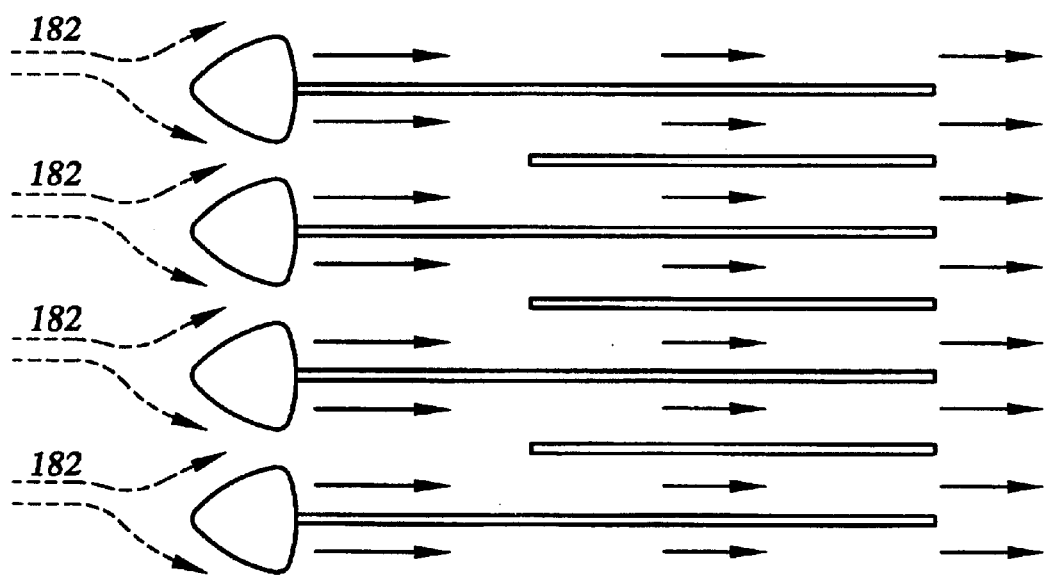
FIG. 9 is a schematic top view depicting the synthetic jet flow out of the spouts and through the heat sink fins in the active heat sink module of FIG. 6.

As the volume of the interior chamber 173 is increased, air is drawn from the vicinity of the lower fins 164 and into the interior chamber 173 through the orifices 179 in the spouts 171. Then, as the volume of the interior chamber 173 is decreased, the air in the chamber 173 is expelled through the orifices 179, vortices are formed at the orifices 179, and a synthetic jet stream is formed from the ambient fluid 182 on an upstream side of the spouts 171. As depicted in FIG. 7, the ambient fluid is drawn from an area near the spouts 171 and caused to flow between the fins 164. FIG. 9 depicts the synthetic jet flow created from the spouts 171, and the resulting ambient flow through and between the various fins 164.

The synthetic jet module 162 and the heat sink component 161 work together such that the synthetic jet module 162 entrains air from the ambient 178, 182 in the direction of the mean flow, so that there is no recirculation of the hot air. The exemplary design 160 also results in every fin 164, 166 in the heat sink component 161 being straddled by a pair of synthetic jets. This maximizes the heated area exposed to the cooling air flow.

As explained above, the synthetic jet module generates two synthetic jet flows. The first flow is generated to flow through the longer heat sink fins and entrain air from above the synthetic jet actuator module and into the channels between the fins. The second form of synthetic jet flow is created to emit from the spouts and to flow though the channels formed by the shorter heat sink fins. As shown in FIG. 7 and FIG. 9, these synthetic jets entrain ambient air upstream of the channels and the spouts and this fluid flows down the channels and out the other side of the heat sink module. In this manner, the flow between the fins of the heat sink physically resembles channel flow through closed rectangular channels, as described above. The dramatic cooling effect of the integrated module is similar.

Figure 10A:
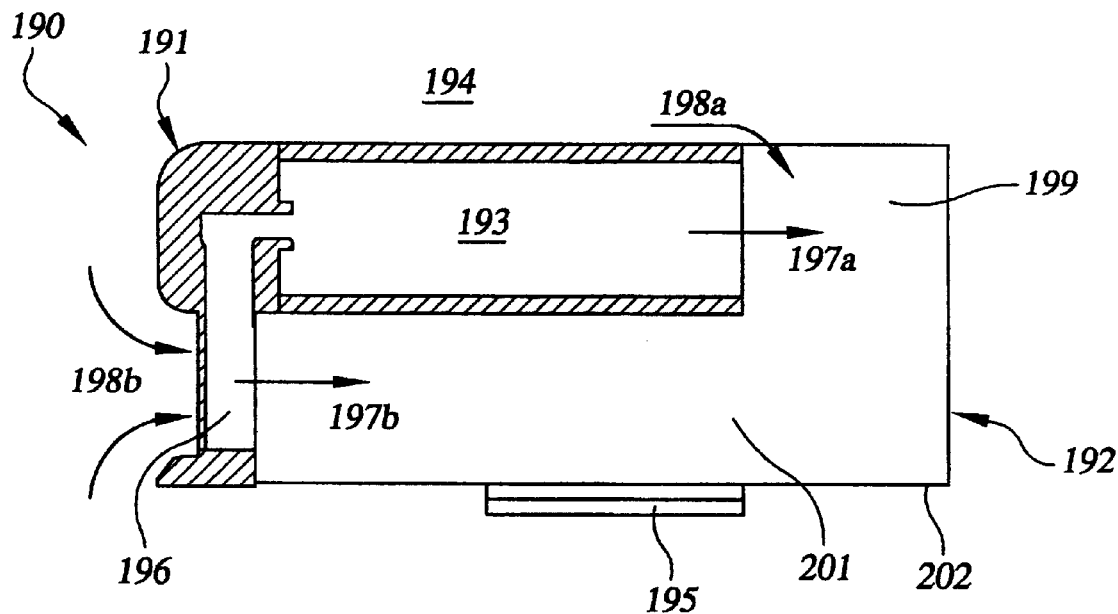
FIG. 10A is a cut-away side view of a second embodiment of an active heat sink module.

As outlined above, there are many possible embodiments of an integrated active heat sink Ail module. For example, FIG. 10A depicts a second embodiment of an active heat sink module 190. This embodiment 190 is very similar to the first exemplary embodiment 160 described above with reference to FIGS. 6–9. However, this integrated module 190 has a synthetic jet module 191 with a single chamber 193 to serve as the driver for two sets of synthetic jet streams. The remainder of the synthetic jet module 191 is the same as above. The design of the heat sink component 192 is identical to the design of the heat sink component 161 described above. The heat sink component 192 includes fins 199, 201 and a base component 202 attached to a heat producing device 195.

Figure 10B:
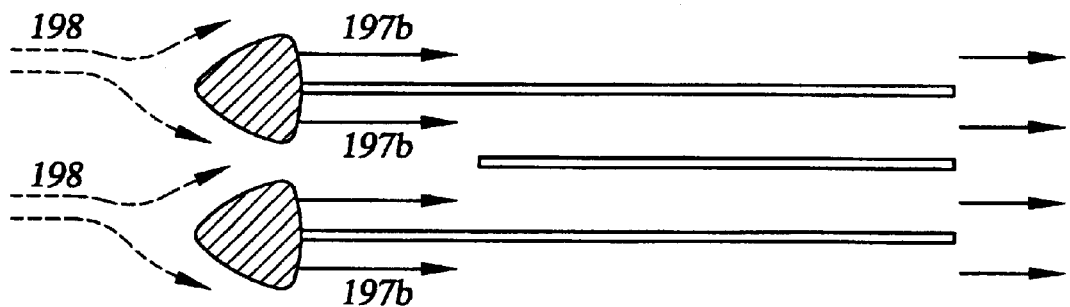
FIG. 10B is a schematic top view depicting the synthetic jet flow out of the spouts and through the heat sink fins in the active heat sink module of FIG. 10A.

As depicted in FIG. 10A, the single chamber 193 has one wall that comprises a flexible material (not depicted). This flexible material is affixed with an electromagnetic actuator (not depicted). When the electromagnetic actuator is activated, the flexible material is caused to oscillate in time-harmonic motion. As the flexible material moves outward with respect to the chamber 193, ambient fluid 194 is drawn into the chamber 193 through both one set of orifices in the spouts 196 and another set of orifices in the module itself 191. Then, as the flexible material moves inward with respect to the chamber 193, fluid 197a, 197b is ejected from the chamber 193 through both orifices in the spouts 196 and orifices in the module 191. As with the active heat sink example above, synthetic jet streams 197a, 197b are created, and ambient fluid 198a, 198b is caused to flow through the channels formed by the heat sink fins 199, 201, as depicted in FIG. 10B.

Figure 11:
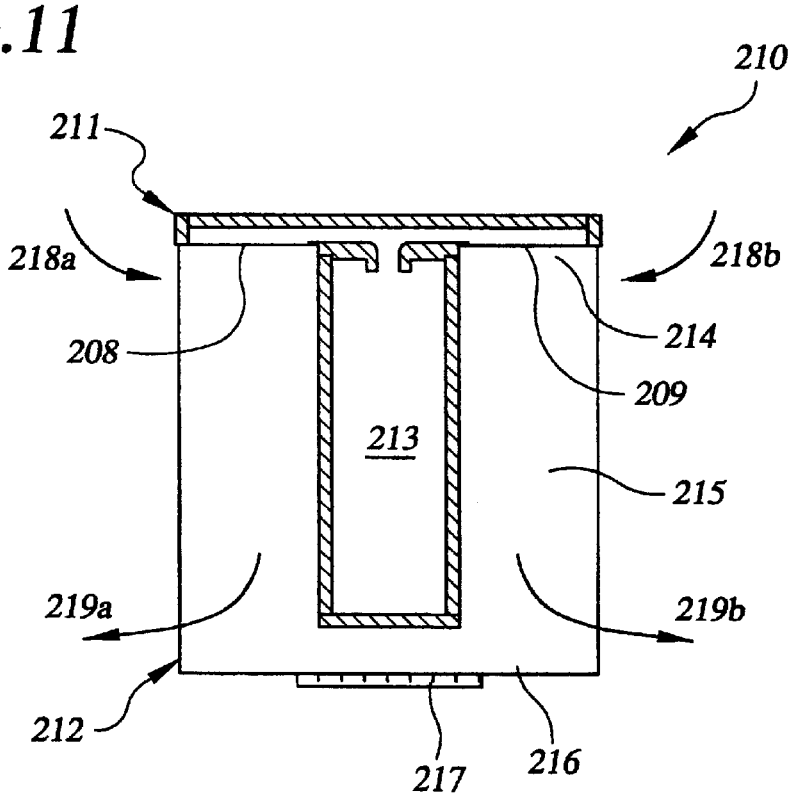
FIG. 11 is a cut-away side view of a third embodiment of an active heat sink module.

FIG. 11 depicts a third embodiment 210 of an active heat sink module. Similar to the embodiment 190 described directly above with respect to FIG. 10A, this third example 210 comprises synthetic jets that are produced from an integrated synthetic jet module 211 embedded into a heat sink 212. In other words, the heat sink component 212 and the synthetic jet module 211 are constructed as a single unit. In this embodiment 210, the synthetic jet module 211 comprises a central chamber 213 driven by an electromagnetic actuator, as described above. The module 211 has two sets of orifices 208, 209 distributed on each side of the central chamber 213. The synthetic jet module 211 is mounted directly to the top portion 214 of heat sink fins 215 extending from a heat sink base 216. Note that the heat sink base 216 is thermally connected to a heat producing object 217, such as an integrated circuit.

When the synthetic jets are operational, ambient air 218a, 218b is entrained from above the heat sink component 212 and driven along the vertical length of the fins 215. The spent air 219a, 219b is expelled from the sides of the heat sink component 212. Cooler ambient air 218a, 218b can be easily ducted to the top of the heat sink 212 without a fan, due to the jet ejector effect, increasing the available thermal budget. Unlike the embodiment 190 described directly above, the fins 215 in this example 210 are directly exposed to ambient air, an added advantage for entraining secondary cool ambient air. However, a pressure drop is induced due to the flow turning at the heat sink base 216 that is not present in the prior embodiments.

Figure 12:
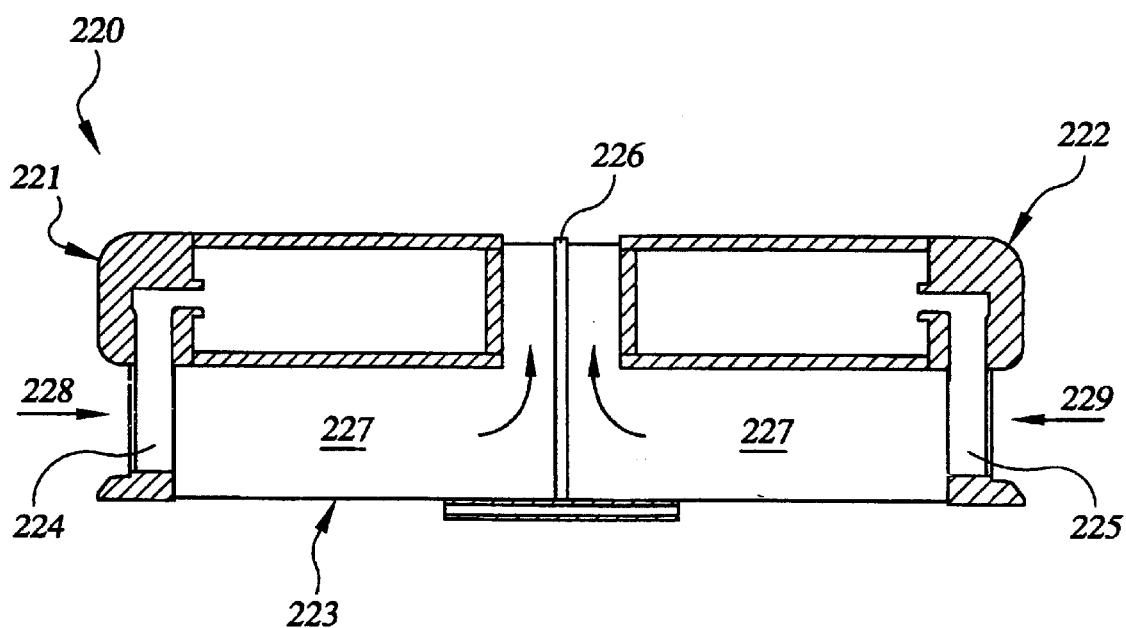
FIG. 12 is a cut-away side view of a fourth embodiment of an active heat sink module.

FIG. 12 depicts a fourth embodiment 220 of an active heat sink module. This embodiment 220 is an adaptation of the second embodiment 190 described above. For this reason, the fourth embodiment 220 does not need to be described in detail. As can be seen in FIG. 12, two chamber-spout systems 221, 222 are mounted on a heat sink component 223. There is only one set of orifices in each chamber-spout system 221, 222, at the spouts 224, 225. Also, there is a single heat sink fin 226 disposed perpendicular to the main heat sink fins 227. In operation, cool ambient air 228, 229 is entrained from the sides and expelled vertically at the center of the heat sink component 223. As with the third embodiment 210 described above, this embodiment 230 exhibits a pressure drop due to the flow turning at the center of the heat sink 223. Similar to the other active heat sink designs, this configuration 230 directs the spent flow in a given direction, which can be ducted away from the heat sink 223 easily, resulting in a larger available thermal budget.

All of the active heat sink devices described above, as well as the ducted heat ejector system are readily scalable for enhanced/reduced thermal energy dissipation. That is, the total thermal energy that can be dissipated using these devices can be increased or decreased by simply changing the number of heat sink fins or the number of synthetic jets. This high level of scalability saves design time for changes in thermal energy dissipated or volume available.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A system for cooling, comprising:
   a. a heated body, wherein heat is contained within said heated body;
   b. an ambient fluid adjacent to an exterior surface of said heated body;
   c. walls forming a channel within an interior of said heated body, said walls of the channel including a heat sink and the heat contained in said heated body being moved into at least one of said walls;
   e. a synthetic jet actuator adjacent to one of said walls, said synthetic jet actuator positioned so as to direct a synthetic jet flow through the channel, wherein the operation of said synthetic jet actuator creates a flow of said ambient fluid though said channel, said ambient fluid cooling said walls of the channel; and
   f. wherein said heat sink is connected to a device producing the heat within said heated body, said synthetic jet actuator and said heat sink being integrated into a single portable cooling module.

2. A system for cooling, comprising:
   a. a heated body enclosing a volume, wherein heat is contained within said heated body;
   b. an ambient fluid adjacent to an exterior surface of said heated body;
   c. walls forming a channel within an interior of said heated body, said channel being configured to isolate said ambient fluid from said volume, the heat contained in said heated body being moved into at least one of said walls; and
   d. a synthetic jet actuator adjacent to one of said walls, said synthetic jet actuator positioned so as to direct a synthetic jet flow through the channel, wherein the operation of said synthetic jet actuator creates a flow of said ambient fluid though said channel, said ambient fluid cooling said walls of the channel.

3. The system of claim 1, wherein at least one of said walls of the channel comprises a thermal spreader material.

4. The system of claim 3, wherein said at least one wall is adjacent to a heat producing object, said heat producing object generating said heat within said heated body.

5. The system of claim 4, wherein said heat producing object comprises an integrated circuit.

6. The system of claim 1, wherein said synthetic jet actuator comprises an array of synthetic jet actuators.

7. The system of claim 1, wherein said synthetic jet actuator comprises:
   a jet housing defined by walls, said jet housing having an internal chamber with a volume of ambient fluid and an opening in said jet housing connecting said chamber to an interior environment of the channel, the interior environment having said ambient fluid; and
   a volume changing means for periodically changing the volume within the internal chamber so that vortex sheets are generated at the opening, the vortex sheets detaching from the opening and forming vortices projecting into the interior environment of the channel, the fluid vortices forming a synthetic jet stream through entrainment of the ambient fluid outside of said jet housing.

8. The system of claim 1, wherein said synthetic jet actuator comprises a cantilevered blade near one of said walls of the channel, said blade being vibrated in time-harmonic motion by an actuation device.

9. The system of claim 1, wherein said synthetic jet actuator is positioned at one end of said walls of the channel.

10. The system of claim 1, wherein said walls of the channel comprise a heat sink.

11. The system of claim 10, wherein said heat sink is connected to a device producing the heat within said heated body, said synthetic jet actuator and said heat sink being integrated into a single portable cooling module.

12. The system of claim 1, wherein said heated body comprises a heat sink having fins, and said walls of the channel comprise said heat sink fins.

13. The system of claim 12, wherein said heat sink is positioned adjacent to a heat producing object such that a thermal energy produced by said heat producing object flows into said heat sink.

14. A system for causing cooling airflow in a channel, comprising:
 a. a device having a shell enclosing a cavity, wherein there are disposed heat producing components in said device cavity;
 b. walls internal to said device, said walls forming a channel through said device, said channel walls having first and second ends located at said shell such that the channel is in fluid communication with an external environment of said device;
 c. a heated component disposed in said device cavity such that a thermal energy produced by said component moves into at least one of said walls of the channel; and
 d. a synthetic jet actuator positioned near said walls, said synthetic jet actuator creating a flow of an ambient fluid from the external environment through the channel, wherein the ambient fluid cools said walls.

15. The system of claim 14, wherein said synthetic jet actuator is built into at least one of said walls.

16. The system of claim 14, wherein said synthetic jet actuator is positioned at the first end of said walls, said synthetic jet actuator causing a synthetic jet fluid flow into the channel.

17. The system of claim 14, wherein said synthetic jet actuator comprises a cantilevered blade near one of said walls of the channel, said blade being vibrated in time-harmonic motion.

18. An integrated heat sink module comprising:
 a heat sink material;
 a heat generating body adjacent to said heat sink material; and
 a synthetic jet actuator incorporated into the heat sink module such that said synthetic jet actuator creates a flow of an ambient fluid along a surface of said heat sink material.

19. The module of claim 18, wherein said heat sink material comprises heat sink fins, wherein said synthetic jet actuator causes the flow of ambient fluid to move between adjacent pairs of said heat sink fins.

20. The module of claim 19, wherein said synthetic jet actuator is positioned at one end of said heat sink fins.

21. A method for cooling a device having heat producing components, comprising the steps of:
 providing said device having an exterior surface, wherein the heat producing components are disposed within the exterior surface of said device, said device further comprising a duct passing though an interior of said device and open to an external environment;
 directing a heat generated by the heat producing components into a wall of the duct;
 generating a synthetic jet steam in the duct; and
 entraining an ambient fluid from the external environment of said device, said entrainment causing the ambient fluid to flow though the duct, the ambient fluid cooling the wall of the duct.

22. The method of claim 21, wherein the wall of the duct comprises a heat spreader material.

23. The method of claim 21, wherein said device comprises a handheld microelectronic device.

24. The method of claim 23, wherein the duct is built into said microelectronic device such that the duct is in fluid communication with the ambient fluid of the external environment.

25. The method of claim 21, wherein the duct comprises a heat sink apparatus.

* * * * *